United States Patent
Durand et al.

(10) Patent No.: US 9,714,096 B2
(45) Date of Patent: Jul. 25, 2017

(54) AIR EXTRACTION UNIT FOR AVIONICS BAY

(71) Applicant: Airbus Operations (SAS), Toulouse (FR)

(72) Inventors: Yves Durand, Aussonne (FR); Bernard Guering, Montrabe (FR)

(73) Assignee: Airbus Operations (SAS), Toulouse (FR)

( * ) Notice: Subject to any disclaimer, the term of this patent is extended or adjusted under 35 U.S.C. 154(b) by 699 days.

(21) Appl. No.: 14/136,746

(22) Filed: Dec. 20, 2013

(65) Prior Publication Data

US 2014/0179211 A1    Jun. 26, 2014

(30) Foreign Application Priority Data

Dec. 21, 2012 (FR) .................... 12 62614

(51) Int. Cl.
*B64D 13/00* (2006.01)
*H05K 7/20* (2006.01)
*B64D 13/06* (2006.01)

(52) U.S. Cl.
CPC .......... *B64D 13/00* (2013.01); *H05K 7/2059* (2013.01); *H05K 7/20145* (2013.01); *B64D 2013/0614* (2013.01); *Y02T 50/44* (2013.01)

(58) Field of Classification Search
CPC ............ B64D 13/00; H05K 7/20; H05K 7/59
USPC ......................................................... 454/76
See application file for complete search history.

(56) References Cited

U.S. PATENT DOCUMENTS

| 4,153,225 A | * | 5/1979 | Paulsen | H05K 7/20572 244/118.1 |
| 2007/0086161 A1 | * | 4/2007 | Hartung | H05K 7/20145 361/695 |
| 2008/0003940 A1 | * | 1/2008 | Haglid | F24F 3/14 454/228 |
| 2012/0298337 A1 | | 11/2012 | Tiwari et al. | |

FOREIGN PATENT DOCUMENTS

GB    2471649    1/2011

OTHER PUBLICATIONS

French Search Report, Aug. 20, 2013.

* cited by examiner

*Primary Examiner* — Helena Kosanovic
(74) *Attorney, Agent, or Firm* — Greer, Burns & Crain, Ltd.

(57) ABSTRACT

An air extraction unit taking the form of a body, the geometric shape of which makes it easier to incorporate into an avionics bay of an aircraft. The air extraction unit derives from a multipurpose approach to the operational components of the avionics bay of an aircraft aimed at achieving weight and cost savings. All of the elements of the air extraction circuit are arranged in a compact housing of the body and are protected by the structure thereof. The air extraction unit can be used as a floor of an avionics bay that can be walked on, with a lateral organization.

6 Claims, 8 Drawing Sheets

AIR EXTRACTION UNIT FOR AVIONICS BAY

CROSS-REFERENCES TO RELATED APPLICATIONS

This application claims the benefit of the French patent application No. 20120062614 filed on Dec. 21, 2012, the entire disclosures of which are incorporated herein by way of reference.

BACKGROUND OF THE INVENTION

The present invention relates to the ventilation of electrical devices in an avionics bay.

The avionics bay of an aircraft, more commonly referred to as an E/E bay, is arranged in a compartment situated under the floor structure of the flight deck, between the nose of the aircraft and the cargo compartment.

Here, most of the aircraft electrical and/or electronic equipment is grouped together in racks. A rack, in the known way, comprises a framework made up of vertical uprights joined together by horizontal transverse shelves, to form a plurality of housings. The electrical and/or electronic equipment of the aircraft is introduced into these housings in the form of functional units. The face of the rack via which the units can be introduced will be referred to in the rest of the description as the open face.

During operation, the electrical equipment in the avionics bay dissipates heat and requires continuous cooling. For this purpose, ventilation circuits based on a principle of blowing and extracting air are installed in the avionics bay. Some elements that make up the ventilation circuits are bulky because they pass round the racks and are complicated to fix in the avionics bay.

FIG. 1 illustrates the circuit used for ventilating a set of racks 1 in an avionics bay of an aircraft. A set of racks is defined as a row of a plurality of racks 3 positioned side by side. The respective frameworks of each of the racks 3 are then fixed together, to form a framework that is common to the set of racks 1.

The ventilation circuit for a set of racks 1 comprises two independent circuits: an air blowing circuit C1 and an air extraction circuit C2. These two circuits C1, C2 are connected to a plurality of air transmission pipes 5 of the set of racks 1. More specifically, each rack 3 comprises at least one air transmission pipe 5 which passes through it from top to bottom in order to cover the largest possible surface area for exchange of heat with the electrical/electronic equipment housed in the rack 3. Each air transmission pipe 5 has a first end 6 situated at the top of the rack, near the top of the avionics bay, and a second end 7 situated at the bottom of the rack, near the floor for walking on of the avionics bay.

The path followed by the flows of air through the various elements illustrated in FIG. 1 is embodied by arrows.

The blowing circuit C1 is made up of main inlet trunking K1 for blowing cold air (arrow Fa) into each rack 3 of the set of racks, which trunking is coupled to a plurality of air inlet pipes E1. Each air inlet pipe E1 is connected to a first end 6 of an air transmission pipe 5.

The cold air becomes heated up as it passes along an air transmission pipe 5. The hot air (arrow Fc), leaving each air transmission pipe 5, is discharged by the air extraction circuit C2 which comprises a plurality of air extraction pipes E2. Each air extraction pipe E2 is connected to a second end 7 of an air transmission pipe. The air extraction pipes E2 are coupled to main hot air extraction trunking K2 which, connected to suction means (not depicted in the figure), is able to suck up the hot airflows. The sucked-up hot air is then discharged (arrow Fd) from the aircraft or treated (arrow Fd) on board the aircraft.

In FIG. 1, and for the sake of making the figure less cluttered, the extraction trunking K2 is depicted in the bottom part of the avionics bay. In real life, the main trunking K1 and K2 are generally situated in the upper part of the avionics bay. The air extraction circuit C2 therefore occupies a great deal of space because the air extraction pipes E2 continue over most of the height (axis z) of the avionics bay.

As a result, the volume occupied by the air extraction circuit C2 presents a great many problems in designing aircraft, especially since, in aircraft of more recent design, the size and number of sets of racks is constantly increasing. However, the size of the avionics bay has to be contained given the constraints on the availability of space within an aircraft.

Thus, installing an air extraction circuit C2 is a complex and costly matter because it entails the production of a great many components of different types and shapes so as to free up as much space as possible in the avionics bay. Some of these components are delicate and the technicians moving around in the avionics bay have therefore to take a great many precautions when performing maintenance operations in the avionics bay. Further, an air extraction circuit C2 comprises multiple complex and heavy systems, such as air suction fans or various valves for example. The weight of these systems means that they have to be fixed to the structure of the aircraft and that additional support elements have therefore to be provided, all of this undermining the very desirable search to find ways of reducing size and bulk in aircraft.

SUMMARY OF THE INVENTION

The invention seeks to overcome the aforementioned constraints by providing an air extraction unit that combines, within a compact volume, a set of functions that were formerly reserved for the air extraction circuits of an avionics bay having a lateral organization.

To this end, the invention proposes an air extraction for an aircraft avionic bay, said unit comprising a body having a housing in which are arranged suction means and discharge means, said suction means being configured to aspirate airflows, hereinafter referred to as suction airflows, from the housing via a plurality of air tappings arranged on the body and to deliver said airflows outside the housing, the delivered airflows being referred to as delivery airflows, via the discharge means which are configured to discharge the delivery airflows from the housing, said air extraction unit comprising a plurality of airflow guide elements arranged in the housing so as to direct the suction airflows toward said suction means and isolate said suction airflows in an airtight manner from the delivery airflows, and the body has a bottom, a lid, these two being substantially parallel to one another, and four side walls adjoining the bottom and the lid, each of the airflow guide elements being resistant to bending and having a first face fixed to an upper face of the bottom, a lower face of the lid being fixed to each of the four side walls and to a second face of each of the airflow guide elements.

Advantageously, the plurality of airflow guide elements is arranged in the housing in such a way as to divide the housing into a chamber, a central zone, a discharge zone and a plurality of ducts which are isolated in an airtight manner from said discharge zone, each duct connecting an air tapping to the central zone in which the plurality of ducts converges, said central zone communicating with the discharge zone via the chamber in which the suction means are situated, said discharge means being situated in the discharge zone.

For preference, the plurality of air tappings is distributed over the four side walls.

Advantageously, the body is of parallelepipedal shape.

For preference, the bottom, the lid and the four side walls and the plurality of airflow guide elements are made of composite. Furthermore, the bottom and the four side walls are preferably produced as a single component obtained by molding.

In one embodiment of the invention, the discharge means comprise at least one valve arranged in an opening made in the bottom and control electronics associated with said at least one valve, the control electronics being configured to control the opening or closing of said at least one valve.

In one embodiment of the invention, the air extraction unit comprises a plurality of fixing means arranged on the body.

The invention also relates to an avionics bay comprising a first and a second set of racks separated by a safety space and each having an open face, the open faces of the first and of the second set of racks facing one another, each one of the first and of the second set of racks comprising a framework, a plurality of air transmission pipes opening into the safety space being distributed along the open face of each of the first and second set of racks, said avionics bay being one which comprises an air extraction unit according to the invention.

For preference, with the air extraction unit being arranged in the safety space, said air extraction unit having its two first side walls parallel to the open faces of the first and second set of racks, each of the plurality of air tappings is connected to one end of each of the plurality of air transmission pipes via a coupling, each of the plurality of fixing means being distributed over the side walls of the air extraction unit that are parallel to the open faces of the first and of the second set of racks and fixed to the framework of the first or second set of racks.

The invention finally relates to an aircraft comprising an air extraction unit as described hereinabove.

BRIEF DESCRIPTION OF THE DRAWINGS

Further details, advantages and features of the invention will become apparent from reading the following description given by way of nonlimiting example and with reference to the attached drawings in which.

Throughout these figures, identical references denote elements that are identical or analogous. The air extraction unit illustrated in FIGS. 2 to 7 comprises, by way of nonlimiting example, just six air tappings, in order not to make the figures overly cluttered.

The frame of reference (O, z) is a frame of reference associated with the aircraft when the latter is on the ground. The axis z denotes the vertical or height axis. The terms "upper" or "top", "lower" or "bottom", and derivatives thereof are defined with reference to this frame of reference.

DETAILED DESCRIPTION OF THE PREFERRED EMBODIMENTS

In the context of the invention, provision is thus made for the avionics bay of an aircraft to be organized with a lateral organization. More specifically, with this organization, two sets of racks are positioned facing one another and separated from one another by a safety space. One set of racks is therefore on one side of the fuselage of the aircraft while the other set of racks is situated on the other side of the fuselage of the aircraft, with respect to the sagittal plane of the fuselage.

Giving the avionics bay a lateral organization allows some of the elements that make up the air circuits of each of the two sets of racks to be common to both. Installing the air extraction circuits in an avionics bay that has a lateral organization is then easier as a result and the weight and space savings are considerable.

In this view of reducing mass and bulk, the invention proposes grouping the air extraction circuit elements for the two sets of racks together into a smaller size air extraction unit that can be prefabricated and be installed quickly in an aircraft. To this end, the air extraction unit according to the invention is intended to be installed in the safety space and has a novel structure that allows it both to incorporate the elements of the extraction circuit of each of the two sets of racks positioned facing one another and also to act as a floor for walking on between the two sets.

Figure 1:
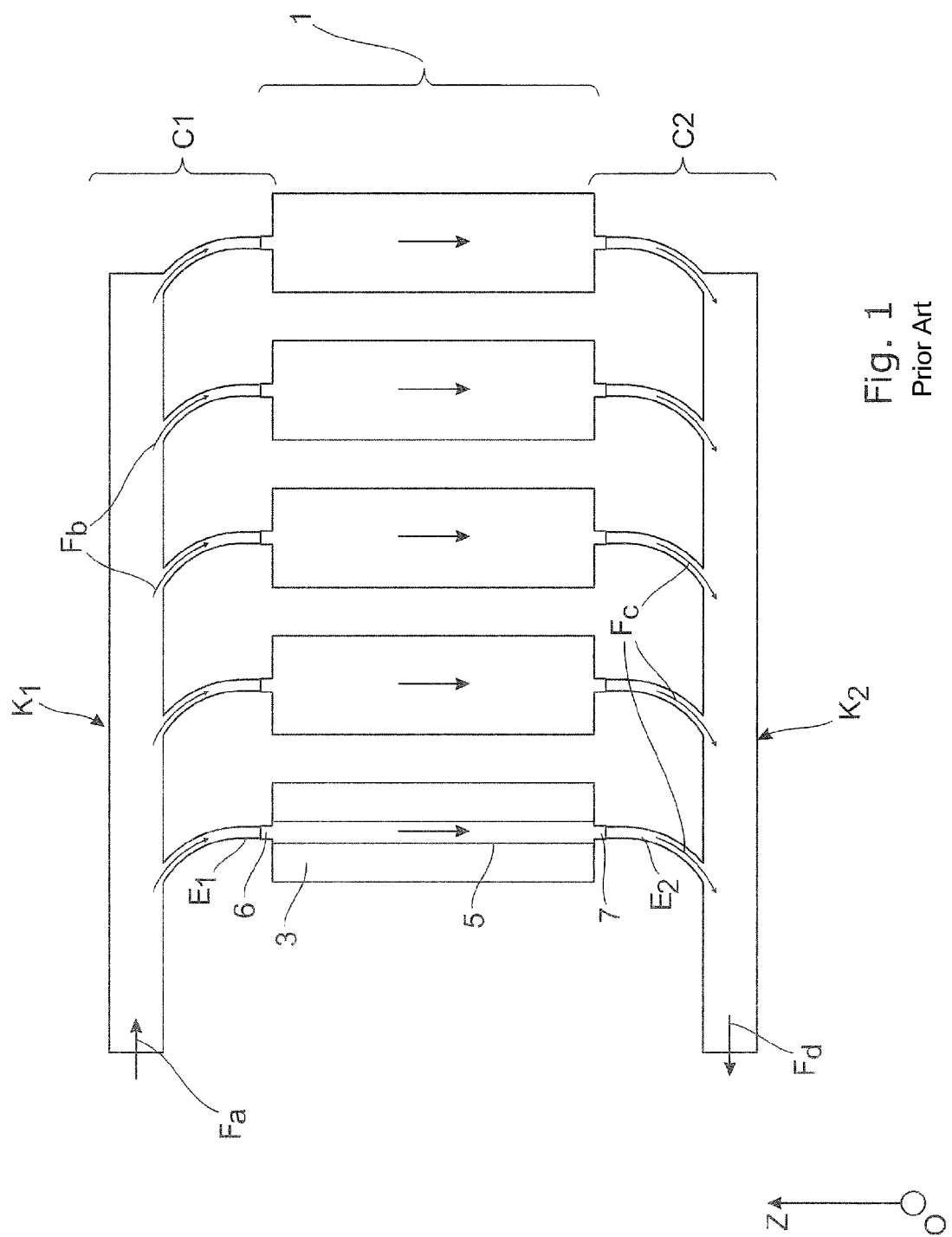
FIG. 1 is a schematic side view of a set of racks of an avionics bay of an aircraft, comprising a ventilation circuit according to the prior art.
Figure 2:
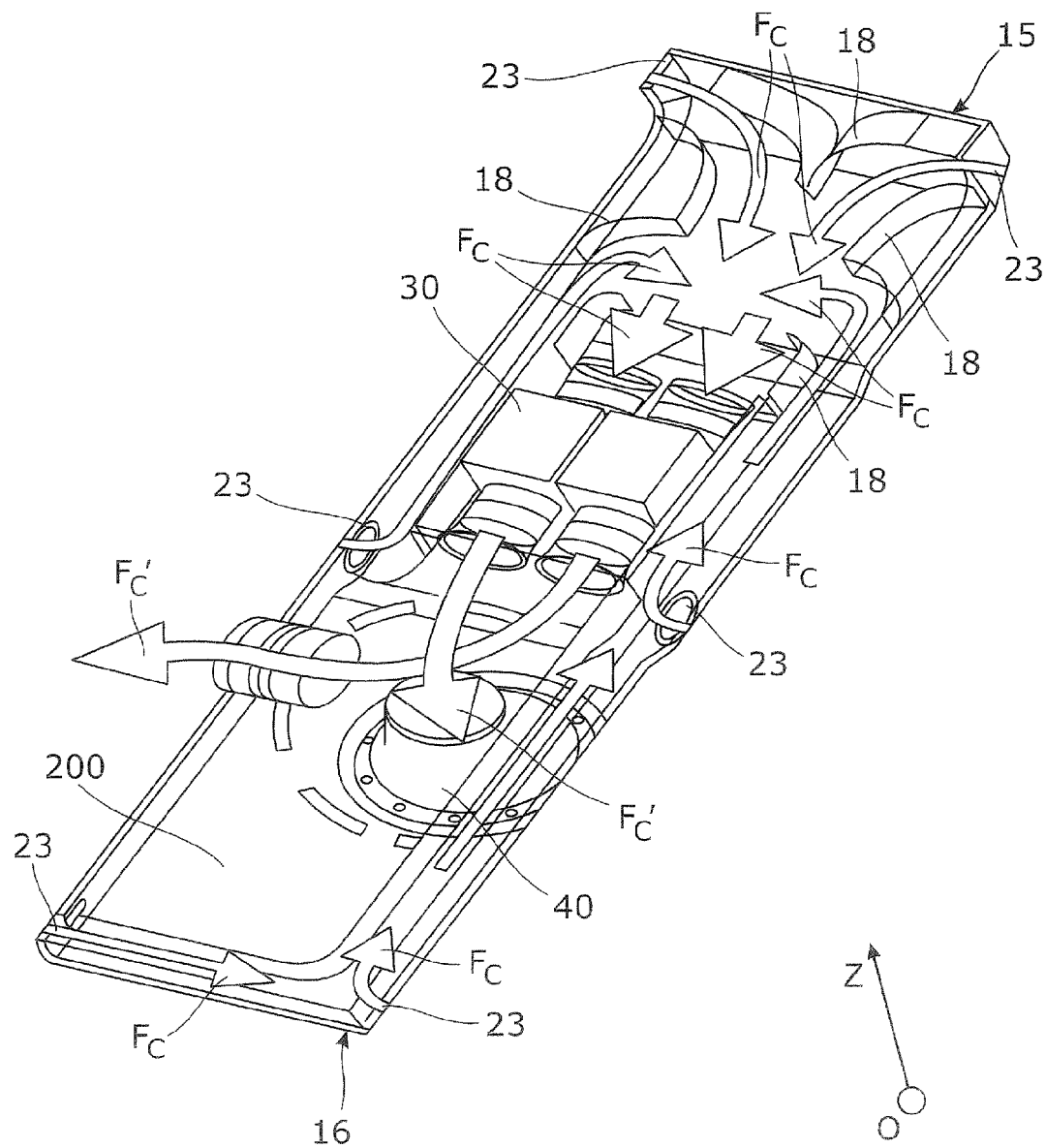
FIG. 2 is a perspective view of an air extraction unit according to the invention, in which an upper face of the body has been depicted to show hidden details.
Figure 3:
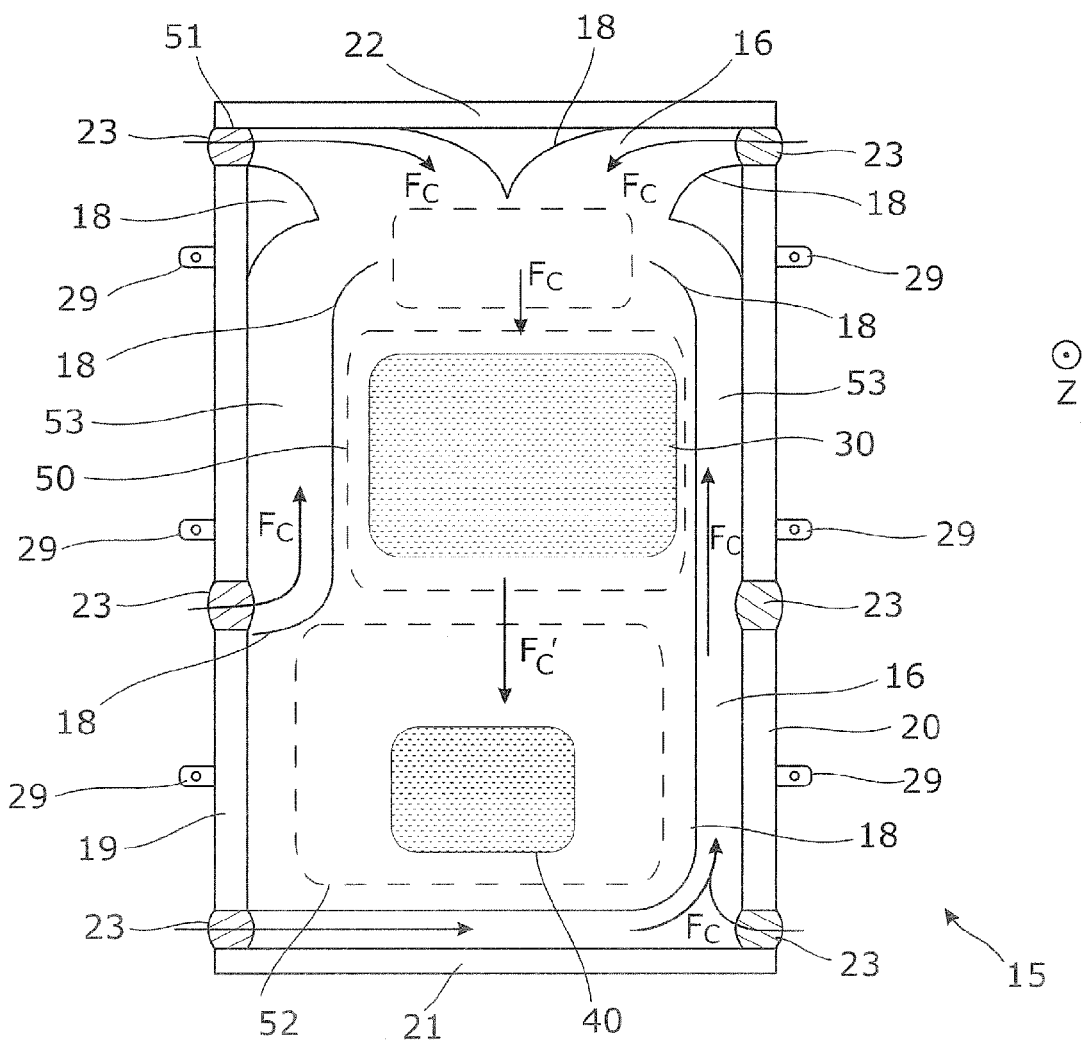
FIG. 3 illustrates a schematic view from above of an air extraction unit according to a preferred embodiment of the invention, and in which the upper face of the air extraction unit has been depicted to show hidden details.

With reference to FIG. 2 and FIG. 3, the air extraction unit according to the invention takes the form of a body 15 comprising a housing 22 in which suction means 30 and discharge means 40 are arranged. The suction means 30 of the air extraction unit are configured to suck up airflows (arrows Fc), hereinafter referred to as suction airflows, from the housing 200 via a plurality of air tappings 23 arranged on the body 15, and to deliver airflows, referred to as delivery airflows (arrows Fc'), to the discharge means 40 of the air extraction unit. The discharge means 40 are configured to discharge the delivery airflows (arrows Fc') from the housing 200. The air extraction unit comprises a plurality of airflow guide elements 18 arranged in the housing 200 so as to direct the suction airflows (arrows Fc) toward the suction means 30 and isolate in an airtight manner the suction airflows (arrows Fc) from the delivery airflows (arrows Fc').

The body 15 comprises a lower wall, hereinafter referred to as the bottom 16, an upper wall, hereinafter referred to as the lid 17 (not depicted in the view showing hidden detail in FIGS. 2 and 3) which are substantially parallel to one another, and four side walls 19, 20, 21, 22 (not depicted in FIG. 2) adjoining the bottom 16 and the lid 17.

The airflow guide elements 18 are designed and arranged in the housing according to the desired aeraulic configuration for the housing 200. What is meant by aeraulic configuration is the distribution of the various airflows in the housing 200. Various shapes of airflow guide elements 18 are thus arranged in the housing 200 in order to isolate in an airtight fashion the suction airflows (arrows Fc) from the delivery airflows (arrows Fc') in order to ensure that the air extraction unit operates effectively.

One aeraulic configuration of the cavity will be described in detail in conjunction with FIG. 3. The plurality of airflow guide elements 18 is arranged in the housing 200 in such a way as to divide it into a chamber 50, a central zone 51, a discharge zone 52 and a plurality of ducts 53 which are isolated in an airtight manner from the discharge zone 52. The ducts 53 are arranged in the housing 200 in such a way as to connect the air tappings 23 to the central zone 51 in which they converge. The central zone 51 communicates with the discharge zone 52 via the chamber 50 in which the suction means 30 of the extraction unit according to the invention are situated.

Each of the air tappings 23, via which the housing 200 communicates with a space outside the body, is intended to be connected to the second end of an air transmission pipe running through a rack.

The plurality of six air tappings 23 is preferably distributed over the side walls 19, 20, 21, 22 so as to keep the upper face of the lid 17 free. This arrangement makes it easier for operators to move around on the lid 17 when the air extraction unit according to the invention is mounted in an avionics bay of an aircraft.

The suction means 30 comprise at least two fans and control electronics associated with these fans. The fan control electronics allow control over the rotational speed of the rotor of each fan on which blades are mounted.

The fan control electronics are an electronic device of the microcontroller type combining the essential elements of a computer: processor, memories and input/output interfaces.

The discharge means 40 comprise at least one valve arranged on the body 15, preferably on the bottom 16. The housing 200 communicates with a space outside the body 15 via the valve arranged on the body 15 when this valve is open. The discharge means 40 also comprise the valve control electronics for controlling the opening or closing of the valves. The valve control electronics are also an electronic device of the microcontroller type.

The invention will be detailed more specifically with the description of one embodiment of the air extraction unit, described in conjunction with FIGS. 3 to 6.

According to this embodiment, the body 15 and the housing 200 are of parallelepipedal shape. The side walls 19, 20, 21, 22 are perpendicular in pairs and in the remainder of the description the two side walls 19, 20 that have the largest surface area will be referred to as first side walls. The other two side walls 21, 22 are referred to as second side walls.

The plurality of six air tappings 23 is preferably distributed over the two first side walls 19, 20 with equal distribution on each of the two first side walls.

Advantageously, the air tappings 23 arranged on one of the first side walls 19 are arranged facing the air tappings 23 arranged on the other of the first side walls 20. This arrangement, through symmetry, simplifies the aeraulic configuration of the air extraction unit according to the invention.

The bottom 16 and the four side walls 19, 20, 21, 22 are produced as a single component, referred to as a shell, which is obtained by molding. The use of a single component to make the bottom 16 and the four side walls 19, 20, 21, 22 allows the structural strength of the body 15 to be improved. This body is made up by fixing the lid 17 to the shell as well as the airflow guide elements 18. For this purpose, the lower face of the lid 17 is fixed, for example by bonding, to each of the side walls 19, 20, 21, 22.

The structure of the body is made of composite. More specifically, the shell is made of a monolithic composite and the lid 17 is made of composite with a structure of the sandwich construction. The airflow guide elements 18 are likewise made of composite, with a thin (of the order of 4 mm) sandwich structure.

The way in which the airflow guide elements 18 are installed is as follows: they are first of all fixed, for example by bonding, to the bottom 16. The airflow guide elements 18 thus have a first face fixed to the upper face of the bottom 16. A second face of each airflow guide element 18 is coated with adhesive, to be fixed to the lower face of the lid 17 when the latter is placed in contact with the side walls 19, 20, 21, 22 for bonding it.

In order to ensure that the airflow guide elements 18 can be fitted accurately and quickly, these elements are equipped with indexing pegs distributed over their faces that are intended respectively to be fixed to the lower face of the lid 17 and to the upper face of the bottom 16. The indexing pegs are positioned in correspondence with drillings made in the lower face of the lid 17 and the upper face of the bottom 16. The drillings are situated at determined locations on the lower face of the lid 17 and on the upper face of the bottom 16, according to the desired aeraulic configuration for the air extraction unit.

The airflow guide elements 18 are designed to be resistant to bending. Thus, they play a structural role because they keep the lid 16 and the bottom 17 a given distance apart and are thus able to absorb the tensile or compressive loadings to which the body 15 may be subjected.

Those faces of the airflow guide elements 18 that are in contact with the side walls 19, 20, 21, 22 are themselves bonded thereto, thus giving the airflow guide elements 18 their functional role. Specifically, attaching the airflow guide elements 18 to the side walls 19, 20, 21, 22, to the upper wall of the bottom 16 and to the lower wall of the lid 17 makes it possible to determine within the housing 200, the aeraulic configuration of the extraction circuit.

The way in which the suction means 30 (not depicted in FIG. 5) are installed in the air extraction unit according to the preferred embodiment of the invention will be described in conjunction with FIGS. 2, 4 and 5, while the installation of the discharge means 40 will be described in conjunction with FIG. 6.

The suction means 30 are designed to be incorporated directly into the chamber 50 without additional components, to make fitting and maintenance operations easier.

To this end, the suction means 30 are incorporated into a unit 31 comprising an air inlet 131 and an air outlet 133 for each of the fans. The fan air inlets 131 are arranged on one and the same lateral face 135 of the unit 31 and open onto the central zone 51 when the unit 31 is installed in the chamber 50. The fan air outlets 133 are also arranged on one and the same lateral face 137 of the unit 31, opposite the face on which the air inlets are arranged, and open onto the discharge zone 52 when the unit is installed in the chamber 50. The connection between the fan inlets 131 and the central zone 51 is achieved by means of flexible couplings 32. The connection between the fan outlets 133 and the discharge zone 52 is likewise achieved using flexible couplings 33.

The unit 31 comprises on its lower face, which is intended to be in contact with the upper face of the bottom 16, a plurality of drillings arranged in a particular pattern. Indexing pegs are arranged on the upper face of the bottom 16, at the location designed for accepting the unit 31. These indexing pegs are intended to be inserted into the drillings made in the unit 31 and are therefore arranged in a pattern that corresponds to the pattern of the drillings of the unit. Fitting the unit 31 into the housing 200 therefore requires no complex positioning step and the risks of incorrect handling are therefore set aside. Fan maintenance operations can therefore be performed quickly and in complete safety, notably operations of cleaning the fan blades.

Figure 4:
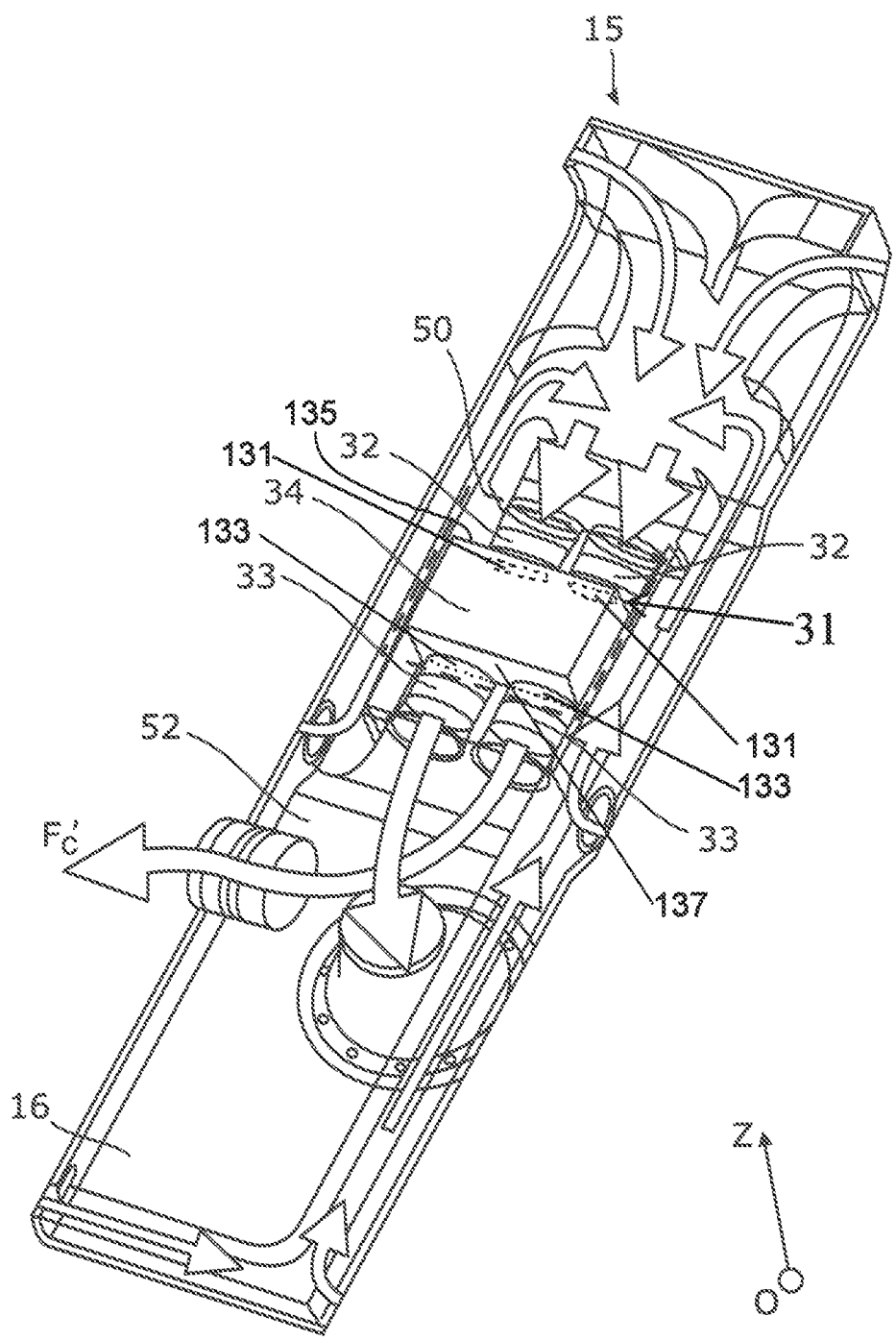
FIG. 4 illustrates a first perspective view of an air extraction unit according to the preferred embodiment of the invention, in which an upper face of the body is depicted to show hidden details.
Figure 5:
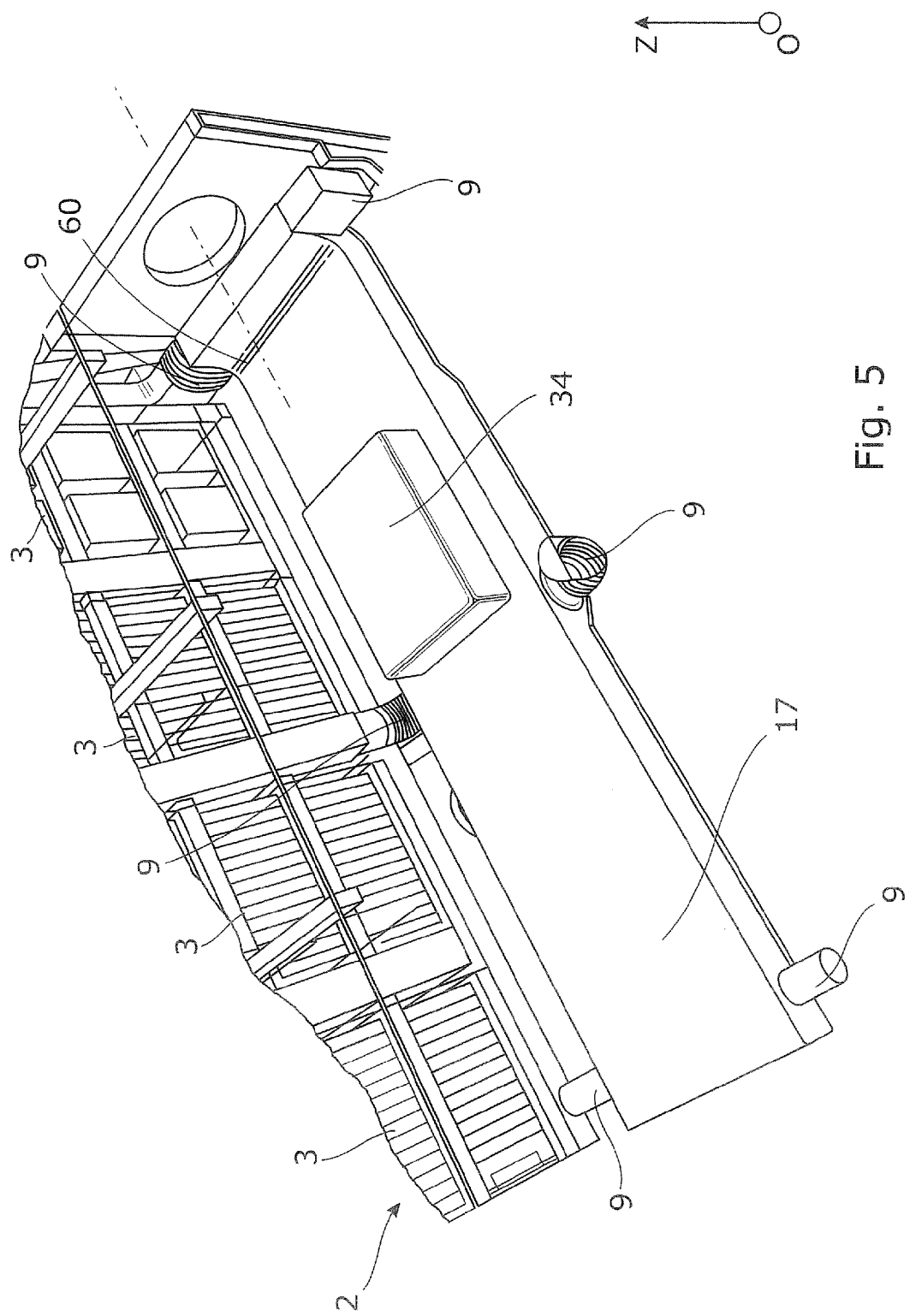
FIG. 5 illustrates a second perspective view of an air extraction unit according to a preferred embodiment of the invention, when this unit is arranged in an avionics bay of an aircraft.
Figure 6:
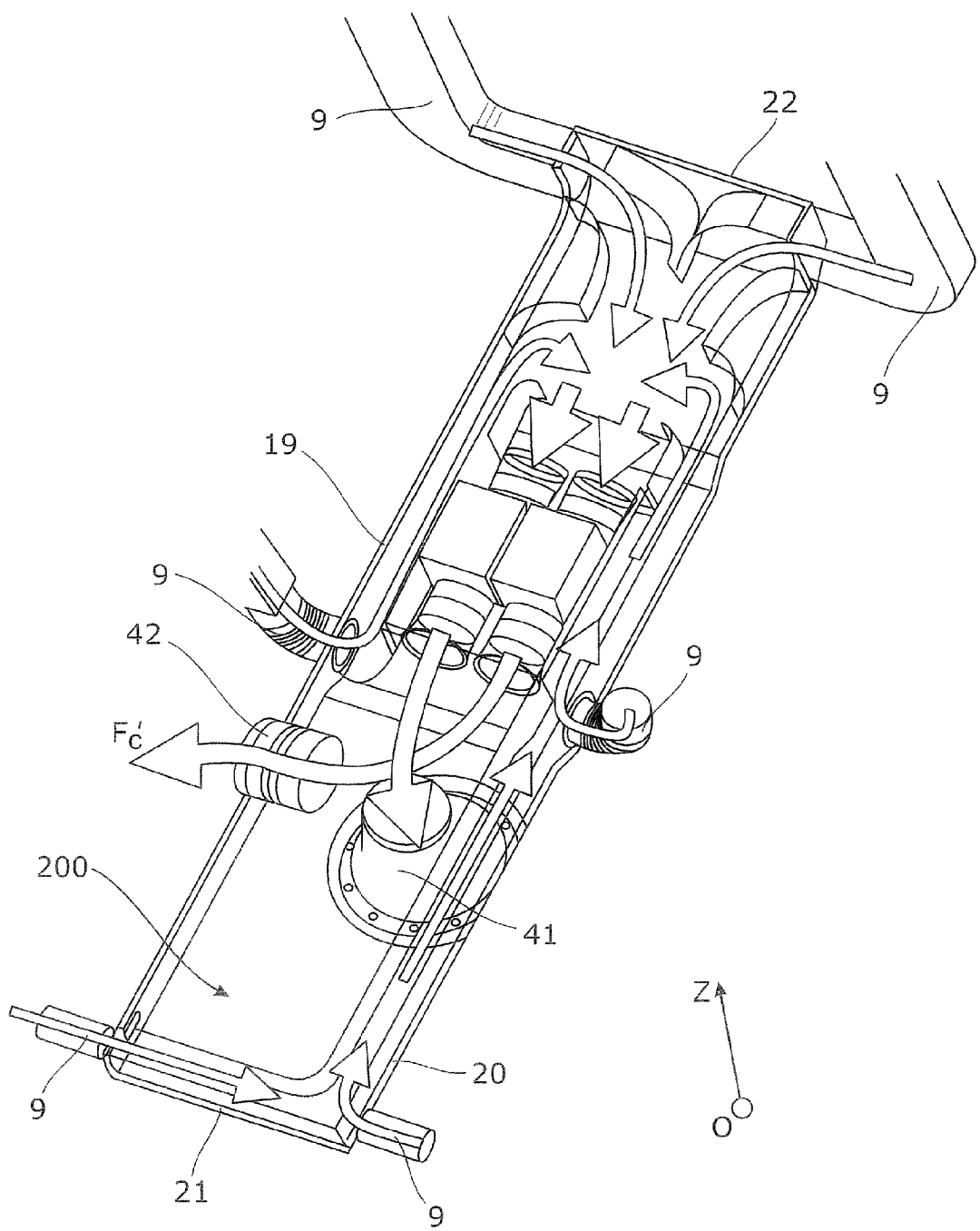
FIG. 6 illustrates a third perspective view of an air extraction unit according to the preferred embodiment of the invention, in which an upper face of the body is depicted to show hidden details.

Fixing means known to those skilled in the art are provided for securing the unit 31 to the housing 200 (not depicted in FIGS. 4 and 5).

An access opening is arranged on the lid 17 so that the suction means 30 can be extracted or introduced without the need to remove the lid 17 from the shell. The access opening is arranged on the lid 17 in such a way that the chamber 50 is in line with the access opening when the lid 17 is fixed to the base.

A soundproofing box 34 covers the access opening and soundproofs the fans. The box 34 is fixed to the upper face of the lid 17 via quick-fit/disconnect means, such as fixings of the wing nut/bolt or spring clip type.

In the preferred embodiment of the invention, the discharge means comprise two valves, a main valve 41 and an overload valve 42.

The main valve 41 is installed in an opening arranged on the bottom 16, while the overload valve 42 is installed in an opening arranged on one of the two first side walls 19, 20.

The control electronics that control the valves 41, 42 are connected to the fan control electronics in order to synchronize the opening/closing of the valves 41, 42 to the rotational speed of the fans. The valves 41, 42 are configured, when open, to discharge the delivery airflows (arrows Fc') to outside the housing 200.

In conjunction with FIGS. 2 and 3, the way in which the air extraction unit according to the invention works is as follows: a flow (arrow Fc) of hot air from a rack is sucked up from the housing 200 under the action of the suction means 30. The suction airflows (arrows Fc) then pass through the air tappings 23 to the central zone 51 via the ducts 53. The suction airflows (arrows Fc) arriving in the central zone 51 are then delivered (arrow Fc') by the suction means 30 to the discharge zone 52, where the discharge means 40 are situated.

Figure 7:
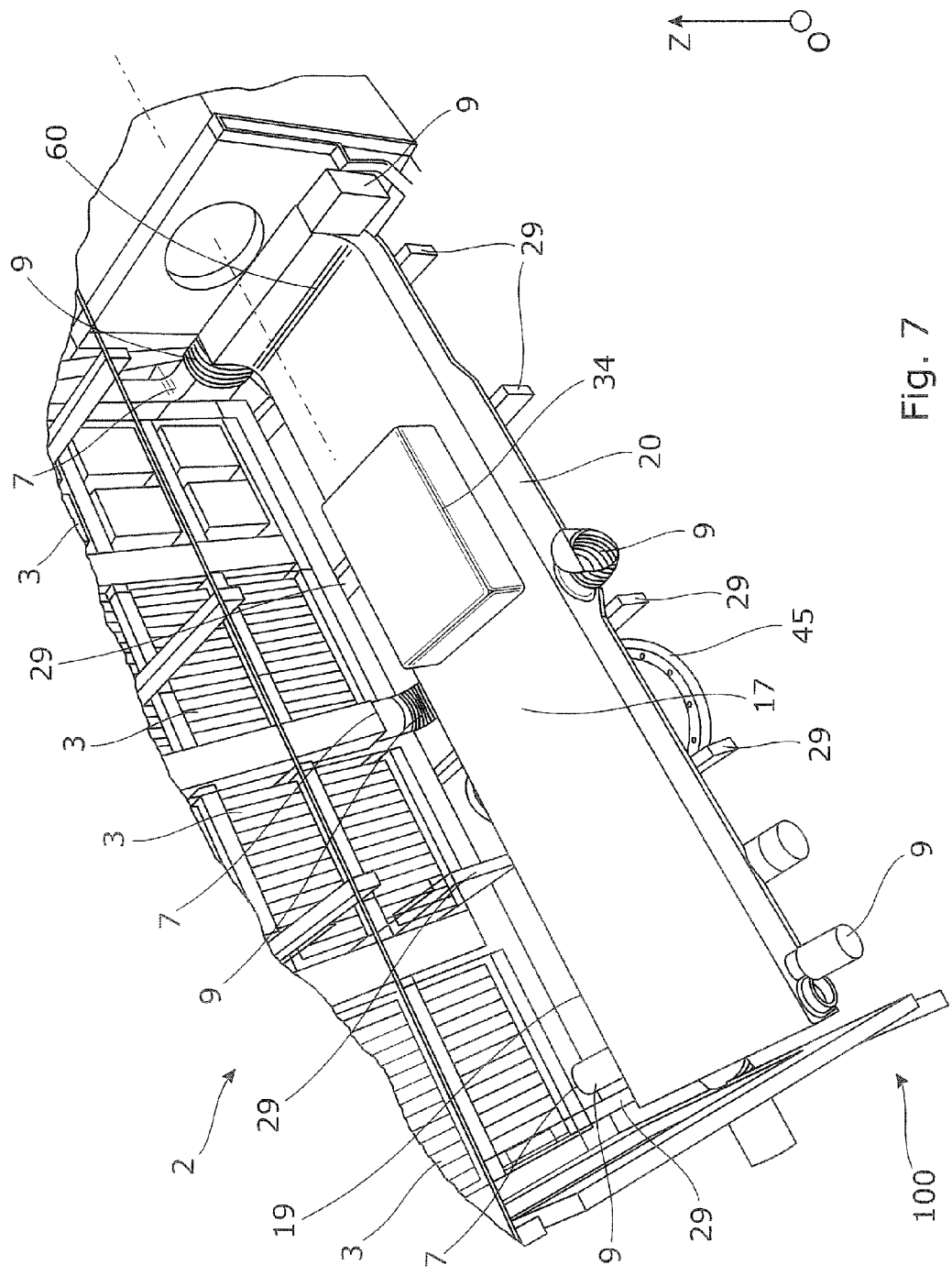
FIG. 7 illustrates a fourth perspective view of an air extraction unit according to a preferred embodiment of the invention, when this unit is arranged in an avionics bay of an aircraft.

The way in which the extraction unit according to the invention is incorporated into an avionics bay with a lateral organization will now be described in conjunction with FIGS. 7 and 8. The description that is to follow relates to the extraction unit according to the preferred embodiment of the invention, although it remains valid for other embodiments.

Figure 8:
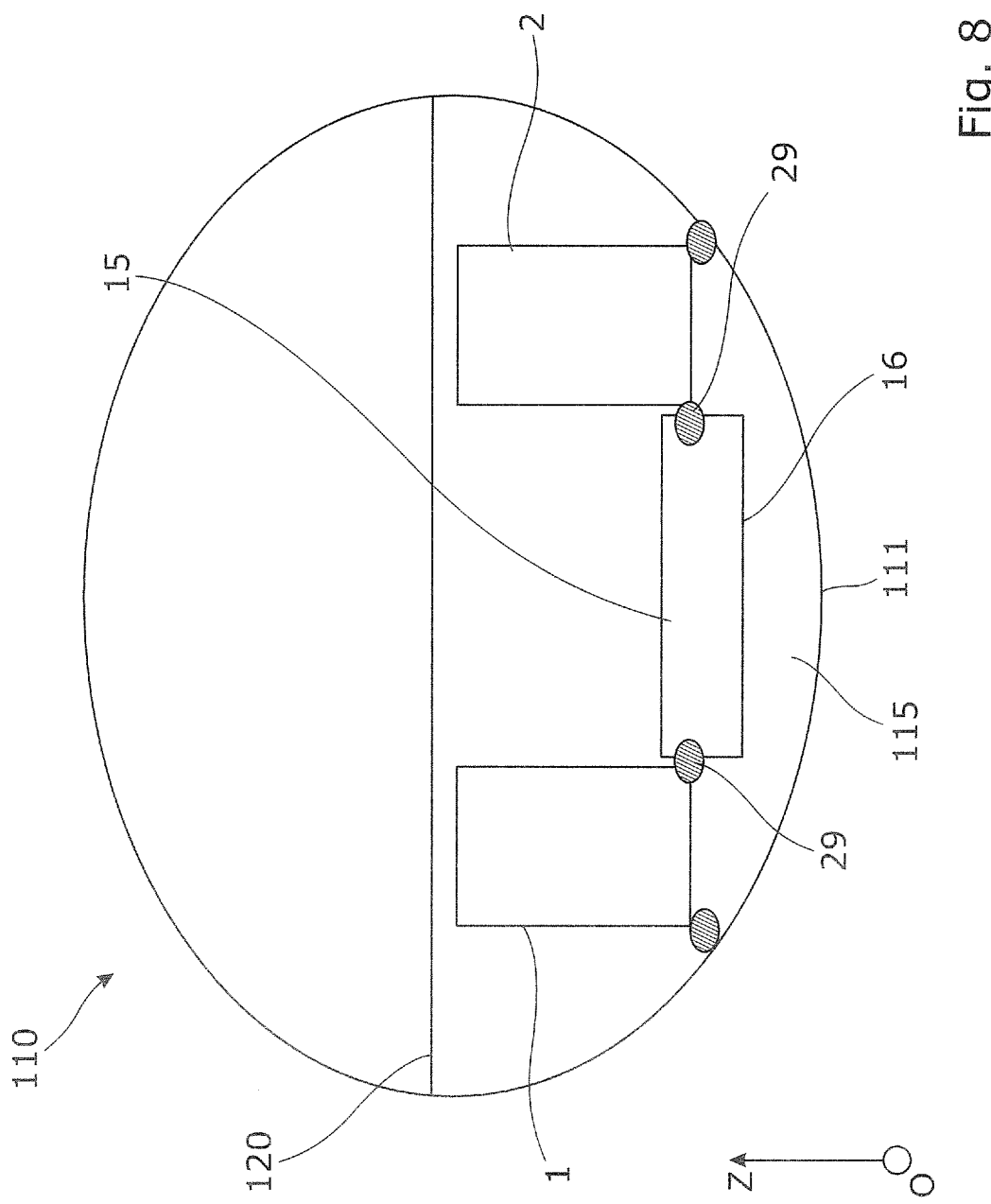
FIG. 8 illustrates a view in section taken through the front part of the fuselage of an aircraft, when an air extraction unit according to the invention is arranged in the avionics bay of the aircraft.

In FIG. 8, the avionics bay 100 is located, by way of example, under the floor 120 of the flight deck.

The avionics bay 100 comprises two sets of racks 1, 2 (the set of racks 1 is depicted to show hidden detail in FIG. 7) placed facing one another. A set of racks 1, 2 is defined as a row of a plurality of racks 3 placed side by side. The respective frameworks of each of the racks 3 are then fixed to one another to form a framework in common for the set of racks 1.

The avionics bay 100 comprises an air blowing circuit. The air blowing circuit C1 is connected to a plurality of air transmission pipes of the set of racks 1, 2. More specifically, each rack 3 of the set of racks 1, 2 comprises at least one air transmission pipe which passes through it from top to bottom so as to cover a surface area that is as large as possible for exchanging of heat with the electrical/electronic equipment housed in the rack 3. Each air transmission pipe has a first end situated at the top of the rack, at the upper part of the avionics bay, and a second end situated at the bottom of the rack, near the floor for walking on of the avionic bay.

The blowing circuit is made up of main inlet trunking for blowing cold air into each rack 3 of the set of racks 1, 2, which trunking is coupled to a plurality of air inlet pipes. Each air inlet pipe is connected to a first end of an air transmission pipe 5.

The racks 3 of a set of racks 1, 2 are all oriented in the same way so as to define an open face for the set of racks and each of the sets of racks has its open face facing the open face of the other set of racks. The open face of a set of racks is that face of the set of racks via which the units can be introduced into the racks that make up the set of racks 1, 2. Thus, the second end 7 of the air transmission pipes 5 of each of the racks 3 of the two sets of racks 1, 2 opens into the safety space.

The air extraction unit according to the invention is then arranged in the safety space in such a way that each of its first side walls 19, 20 is arranged parallel to the open face of each of the sets of racks 1, 2 and that the upper face of the lid 17 is the upper face of the air extraction unit.

Advantageously, the air extraction unit then acts as a floor for walking on of the avionics bay 100. Specifically, the air extraction unit is installed in the lower part of the avionics bay, with its air tappings 23 situated near the second ends 7 of the air transmission pipes of the racks 3. The solid construction of the air extraction unit made of composite makes it capable of bearing the weight of the operators who may work in the safety space moving around on the upper face of the lid 17.

The upper face of the lid 17 is then preferably covered with an attack-resistant coating in order to protect its composite structure from the repeated passage of operators.

In a first alternative form of embodiment, the air extraction unit according to the invention is fixed to the structure of the aircraft 110 via structural supports known to those skilled in the art and which will not be detailed.

For preference, and according to a second alternative form of embodiment, the air extraction unit is held directly in the environment of the avionics bay 100 in a fixture of the suspended type. Mounting the air extraction unit in a suspended manner frees up a volume 115 that had previously been fixed with air extraction circuit elements according to the prior art. The volume 115 is situated between the skin 111 of the aircraft 110 and the lower face of the bottom 16. The volume 115 can be used to house certain elements of the avionics bay 100, such as part of the air conditioning system for example.

To mount the air extraction unit in a suspended manner, fixing means 29 are arranged on the body. The fixing means 29 are, for example, mechanical components of the fitting or bracket type or any other mechanical component of known type that allows one element to be fixed to another.

For preference, the fixing means 29 are arranged on each of the two first side walls 19, 20 of the body. The air extraction unit is then fixed, via the fixing means 29, to the framework of each of the sets of racks 1, 2 of the avionics unit 100. More specifically, each fixing means 29 is fixed, for example by screwing, to the upright of one of the racks 3. The upright to which the fixing means 29 is fixed is the one situated on the open face of the set of racks 1, 2 which faces the first side wall 19, 20.

The possibility of mounting the air extraction unit according to the invention on the framework of the sets of racks 1, 2 means that it can be secured and connected to the avionics bay in a non-critical mounting zone. More specifically, the air extraction unit can be mounted securely in the avionics bay 100 and connected (this then means electrical and aeraulic connection) thereto outside of the aircraft 110, i.e. outside of the critical mounting zone. The avionics bay, in the form of a pallet or of a container, can then be installed in the airplane via the cargo compartment thereof for example. That makes it possible to limit the length of time for which operators are present in the avionics bay 100, given that a large proportion of the securing and electrical connection operations would have already been carried out outside of the aircraft 110.

The suction means 40 and the discharge means 41 are connected to the electrical network of the avionics bay via a wiring system internal to the air extraction unit according to the invention.

Aeraulic connection means the connection of the air tappings 23 of the air extraction unit to the second ends 7 of the air transmission pipes of the racks 3 of the avionics bay 100. This connection is performed using couplings 9. Each coupling 9 connects an air tapping 23 of the air extraction unit to a second end 7 of an air transmission pipe 5 of a rack 3.

When the avionics bay comprising the air extraction unit according to the invention is installed in the aircraft, the main valve 41 arranged on the bottom 16 of the air extraction unit is connected to an external ejection valve 45 of the aircraft A, via a coupling. The external ejection valve 45 is used for ejecting airflows from the aircraft 110 and is generally installed in an opening arranged in the skin 111 of the aircraft 110, in the lower part thereof.

In order to save installation time and for preference, a single valve, referred to as the fuselage vent, may replace the main valve 41 and the external ejection valve 45. In such case, when the air extraction unit is being assembled in the aircraft, the fuselage vent is connected to the air extraction unit via a coupling. When the air extraction unit is offered up into the aircraft, the fuselage vent is then fixed to the fuselage via screws at the periphery of an opening arranged in the skin 111 of the aircraft 110, in the lower part thereof Screwing is done from outside the airplane.

The rotational speed of the rotors of the fans of the suction means 30 and the opening/closing of the valves 41, 42 is dependent on a signal sent by a control device that monitors the cooling of the racks 3. This cooling control device comprises temperature and pressure sensors installed in each of the racks 3 of the avionics bay 100. The device that controls the cooing of the racks 3 commands the opening or closing of the valves 41, 42 and controls the fan control electronics to increase or decrease suction and thus control the cooling of the racks according to the temperature and pressures detected in the racks.

To make the task of the operators easier, the soundproofing box 34 is preferably provided so that it forms a bump that an operator can sit on. Specifically, the low height of the avionics bay 100 in an aircraft 110 does not allow an operator to stand upright and the bump therefore makes fitting or maintenance operations easier.

The parallelepipedal shape of the air extraction unit according to the invention allows the latter to be designed quickly and uncomplicatedly. By way of example, an air extraction unit according to the invention, having six air tappings 23 distributed equally between the two first side walls 19, 20, comprises fewer than ten or so airflow guide elements 18.

The upper face of the lid 17 is preferably flat. However, its shape may be adapted for the purposes of incorporating it into an avionics bay. As depicted by way of illustration in FIGS. 5 and 7, the lid 17 has an inclined part 60 extending upwards so as to suit the configuration of the avionics bay 100.

Mounting, inspecting or repairing the elements incorporated in the housing 200 (which is not depicted in FIGS. 7 and 8) are made easier by the installation of inspection hatches arranged on the bottom 16 or the lid 17. When open, each inspection hatch has an opening providing access to the housing 200. The inspection hatches are fitted with seals in order to seal the housing 200 when they are closed.

For preference, an inspection hatch is provided in the bottom 16, opposite an inspection hatch arranged on the lid 17 or facing the access opening provided for accessing the fans. This arrangement allows rapid access to the volume 115 situated between the bottom 16 and the skin 111 of the aircraft 110. This arrangement for example allows rapid access to the volume 115 in which electrical systems of the aircraft (ground power connector of the aircraft 110 and electrical connection of power cables) are installed.

All of the elements that perform functions previously reserved for a great many bulky and expensive systems of the air extraction circuit of an aircraft bay, and which are arranged in the housing 200, are protected by the compact structure of the body 15.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. An avionics bay of an aircraft comprising:
   a first and a second set of racks separated by a safety space and each having an open face, the open faces of the first and of the second set of racks facing one another, each one of the first and second set of racks comprising a framework,
   a plurality of air transmission pipes opening into the safety space being distributed along the open face of each of the first and second set of racks, and,
   an air extraction unit comprising:
      a body comprising a housing in which are arranged suction means and discharge means,
      said suction means being configured to aspirate airflows, hereinafter referred to as suction airflows, from the housing via a plurality of air tappings arranged on the body and to deliver said airflows outside the housing, the delivered airflows outside the housing being referred to as delivery airflows, via the discharge means, said air extraction unit comprising a plurality of airflow guide elements arranged in the housing so as to direct the suction airflows toward said suction means and isolate said suction airflows in an airtight manner from the delivery airflows, the body comprising a bottom and a lid, these two being substantially parallel to one another, and four side walls adjoining the bottom and the lid, each of the airflow guide elements being resistant to bending and being fixed to an upper face of the bottom, and a lower face of the lid being fixed to each of the four side walls and to the airflow guide elements, wherein a plurality of fixing means is arranged on the body, each of the plurality of fixing means being distributed over the side walls of the air extraction unit that are parallel to the open faces of the first and of the second set of racks and fixed to the framework of the first or second set of racks, and wherein said air extraction unit is arranged in the safety space, and wherein said air extraction unit has its two first side walls parallel to the open faces of the first and second set of racks, and wherein each of the plurality of air tappings being connected to one end of each of the plurality of air transmission pipes via a coupling.

2. The avionics bay as claimed in claim 1, wherein the plurality of airflow guide elements is arranged in the housing in such a way as to divide the housing into a chamber, a central zone, a discharge zone and a plurality of ducts which are isolated in an airtight manner from said discharge zone, each duct connecting an air tapping to the central zone in which the plurality of ducts converges, said central zone communicating with the discharge zone via the chamber in which the suction means are situated, said discharge means being situated in the discharge zone.

3. The avionics bay as claimed in claim 1, wherein the body is of parallelepipedal shape.

4. The avionics bay as claimed in claim 1, wherein the bottom, the lid and the four side walls and the plurality of airflow guide elements are made of composite.

5. The avionics bay as claimed in claim 1, wherein the bottom and the four side walls are molded as a single component.

6. The avionics bay as claimed in claim 1, wherein the discharge means comprise at least one valve arranged in an opening made in the bottom and control electronics associated with said at least one valve, the control electronics being configured to control the opening or closing of said at least one valve.

* * * * *